(12) United States Patent
Liu et al.

(10) Patent No.: US 12,543,442 B2
(45) Date of Patent: Feb. 3, 2026

(54) DISPLAY PANEL

(71) Applicant: KunShan Go-Visionox Opto-Electronics Co., Ltd., Jiangsu (CN)

(72) Inventors: Mingxing Liu, Jiangsu (CN); Jingjing Zhao, Jiangsu (CN); Shizhen Feng, Jiangsu (CN); Wenxing Li, Jiangsu (CN); Weili Li, Jiangsu (CN); Shuaiyan Gan, Jiangsu (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 492 days.

(21) Appl. No.: 17/523,110

(22) Filed: Nov. 10, 2021

(65) Prior Publication Data

US 2022/0069253 A1 Mar. 3, 2022

Related U.S. Application Data

(63) Continuation of application No. PCT/CN2020/105243, filed on Jul. 28, 2020.

(30) Foreign Application Priority Data

Nov. 25, 2019 (CN) .......................... 201911166890.2

(51) Int. Cl.
*H10K 59/122* (2023.01)
*H10K 59/131* (2023.01)
*H10K 59/80* (2023.01)

(52) U.S. Cl.
CPC ....... *H10K 59/122* (2023.02); *H10K 59/1315* (2023.02); *H10K 59/8723* (2023.02);
(Continued)

(58) Field of Classification Search
CPC .......... H10K 50/8428; H10K 59/8723; H10K 50/82–824; H10K 59/8052–80524;
(Continued)

(56) References Cited

U.S. PATENT DOCUMENTS 7,109,653 B2 * 9/2006 Imamura .............. H10K 59/122
313/506
8,149,498 B2 * 4/2012 Hsieh ................. H10K 50/8426
359/296
(Continued)

FOREIGN PATENT DOCUMENTS

CN 101154600 A 4/2008
CN 104733497 A 6/2015
(Continued)

OTHER PUBLICATIONS

EP Search Report dated Aug. 5, 2022 in EP Application No. 20894904.0; 8 pages.
(Continued)

*Primary Examiner* — Chad M Dicke
*Assistant Examiner* — Mario Andres Autore, Jr.
(74) *Attorney, Agent, or Firm* — Rimon PC

(57) ABSTRACT

The present application provides a display panel defining a display area and a non-display area located around the display area, the display panel includes: a cathode lapping assembly located in the non-display area of the display panel, the cathode lapping assembly includes an organic planarization layer, a seal layer, a cathode connecting wire and a cathode lead-out wire stacked sequentially, wherein the cathode lead-out wire extends to the display area and connects with the cathode in the display area, the cathode connecting wire is configured to receive an external circuit signal and send the external circuit signal to the cathode lead-out wire, and the seal layer is configured to block water (Continued)

and oxygen in the organic planarization layer. In this way, the present application can reduce the erosion of the cathode connecting wire by the water and oxygen in the organic planarization layer.

15 Claims, 1 Drawing Sheet

(52) U.S. Cl.
CPC ....... *H10K 59/873* (2023.02); *H10K 59/8052* (2023.02); *H10K 59/874* (2023.02)

(58) Field of Classification Search
CPC ............... H10K 59/122; H10K 59/131; H10K 59/80–871; H10K 59/874; H10K 59/1315; B81C 1/00212; H01L 21/3213
See application file for complete search history.

(56) References Cited

U.S. PATENT DOCUMENTS

| | | | | |
|---|---|---|---|---|
| 2002/0158568 | A1* | 10/2002 | Satake | H10K 59/873 313/493 |
| 2003/0129790 | A1* | 7/2003 | Yamazaki | H10D 86/441 438/149 |
| 2005/0218396 | A1* | 10/2005 | Tsuchiya | H10K 59/124 257/E27.111 |
| 2005/0224820 | A1* | 10/2005 | Yamazaki | H10K 50/828 257/79 |
| 2010/0157412 | A1* | 6/2010 | Lee | G02F 1/1679 445/25 |
| 2010/0157585 | A1* | 6/2010 | Diekmann | H10K 50/13 362/228 |
| 2012/0258600 | A1* | 10/2012 | Godet | H01L 21/2658 438/705 |
| 2014/0353609 | A1* | 12/2014 | Song | H10K 71/00 438/23 |
| 2015/0060806 | A1* | 3/2015 | Park | H10K 50/8428 257/40 |
| 2015/0380685 | A1* | 12/2015 | Lee | H10K 59/1213 257/40 |
| 2016/0013441 | A1* | 1/2016 | Hong | H10K 50/8426 257/40 |
| 2016/0204185 | A1* | 7/2016 | Iijima | H10K 50/8445 257/91 |
| 2016/0204373 | A1* | 7/2016 | Park | H10K 59/124 257/40 |
| 2016/0211480 | A1* | 7/2016 | Hanari | H10K 50/8423 |
| 2016/0268540 | A1* | 9/2016 | Kim | H10K 50/8445 |
| 2016/0276620 | A1* | 9/2016 | Hong | H10K 59/8794 |
| 2017/0033312 | A1* | 2/2017 | Kim | H10K 59/873 |
| 2017/0053973 | A1* | 2/2017 | Park | H10K 50/844 |
| 2017/0237025 | A1* | 8/2017 | Choi | H10K 50/844 257/40 |
| 2017/0277288 | A1* | 9/2017 | Choi | G06F 3/0412 |
| 2017/0287995 | A1* | 10/2017 | Kim | H10K 59/124 |
| 2017/0331058 | A1* | 11/2017 | Seo | H10K 50/8445 |
| 2018/0102502 | A1* | 4/2018 | Kim | H10K 59/124 |
| 2018/0151838 | A1* | 5/2018 | Park | H10K 50/8445 |
| 2018/0226607 | A1* | 8/2018 | Li | H10K 50/8426 |
| 2018/0342655 | A1* | 11/2018 | Cho | H10H 20/854 |
| 2019/0081117 | A1* | 3/2019 | Moon | H10K 59/122 |
| 2019/0334109 | A1* | 10/2019 | Liu | H10K 50/11 |
| 2020/0168823 | A1* | 5/2020 | Kim | H10K 50/844 |
| 2021/0159287 | A1* | 5/2021 | Cheng | H10K 59/122 |
| 2021/0210571 | A1* | 7/2021 | Zhang | H10K 59/8723 |

FOREIGN PATENT DOCUMENTS

| | | | | |
|---|---|---|---|---|
| CN | 105720079 | A | | 6/2016 |
| CN | 106847867 | A | | 6/2017 |
| CN | 106848103 | A | | 6/2017 |
| CN | 107068727 | A | | 8/2017 |
| CN | 107785402 | A | * 3/2018 | ........... G06F 3/0412 |
| CN | 108198838 | A | | 6/2018 |
| CN | 108461530 | A | | 8/2018 |
| CN | 108649063 | A | * 10/2018 | ......... H01L 27/3276 |
| CN | 110473896 | A | | 11/2019 |
| CN | 110752250 | A | | 2/2020 |
| EP | 3327786 | A1 | * 5/2018 | ........... G06F 3/0412 |
| JP | 2005302707 | A | | 10/2005 |
| JP | 2005309400 | A | | 11/2005 |
| JP | 2012160388 | A | | 8/2012 |
| JP | 2015118796 | A | | 6/2015 |
| JP | 2016134236 | A | | 7/2016 |
| JP | 2019102337 | A | | 6/2019 |
| KR | 20140080231 | A | | 6/2014 |
| KR | 20150030088 | A | | 3/2015 |
| KR | 10-2016-0088799 | A | | 7/2016 |

OTHER PUBLICATIONS

Korean Patent Office Notice of Preliminary Rejection (Request for the Submission of an Opinion), including English translation, issued Dec. 4, 2023, corresponding to Korean Application No. 10-2021-7041308; 13 total pages.
JP Decision to Grant a Patent for JP Application No. 2021-577663, dated Jun. 6, 2023; 6 total pages (including English translation).
PCT International Search Report for International Application No. PCT/CN2020/105243 dated Nov. 2, 2020.
PCT Written opinion for International Application No. PCT/CN2019/118928 dated Nov. 2, 2020.
Chinese First Office Action for CN Application No. 201911166890.2 dated Jan. 25, 2021.
Japanese First Office Action (with English translation), dated Jan. 10, 2023, corresponding to Japanese Application No. 2021-577663; 8 total pages.

* cited by examiner

DISPLAY PANEL

CROSS-REFERENCE TO RELATED APPLICATIONS

The application is a Continuation Application of PCT application No. PCT/CN2020/105243, filed on Jul. 28, 2020, which claims priority of Chinese patent application No. 201911166890.2, filed on Nov. 25, 2019. All of the aforementioned applications are incorporated herein by reference in their entireties.

TECHNICAL FIELD

The disclosure relates to display technology, and in particular to a display panel.

BACKGROUND

The display panel is generally defined with a display area and a non-display area located around the display area, a cathode of the display panel generally extends from the display area to the non-display area and is connected to a cathode lapping assembly in the non-display area. An external driving circuit can transmit electrical signals to the cathode through the cathode lapping assembly.

However, the wires in the cathode lapping assembly are susceptible to eroded by water and oxygen in the surrounding organic matter, which may affect the display quality.

SUMMARY

The main technical problem addressed in this application is to provide a display panel that can reduce the erosion of cathode connecting wire by water and oxygen in an organic planarization layer.

To solve the above-mentioned problems, one technical solution of the present application is to provide a display panel defining a display area and a non-display area located around the display area. The display panel includes: a cathode lapping assembly located in the non-display area of the display panel, wherein the cathode lapping assembly includes an organic planarization layer, a seal layer, a cathode connecting wire and a cathode lead-out wire stacked sequentially; wherein the cathode lead-out wire extends to the display area and connects with a cathode in the display area, the cathode connecting wire is configured to receive an external circuit signal and send the external circuit signal to the cathode lead-out wire, and the seal layer is configured to block water and oxygen in the organic planarization layer.

The advantage of the present application is as follows: the display panel provided by the present application includes a cathode lapping assembly located in the non-display area, wherein the cathode lapping assembly includes an organic planarization layer, a seal layer, a cathode connecting wire and a cathode lead-out wire stacked sequentially, wherein the cathode lead-out wire extends to the display area and connects with the cathode in the display area, the cathode connecting wire is configured to receive an external circuit signal and send the external circuit signal to the cathode lead-out wire, and the seal layer is configured to block water and oxygen in the organic planarization layer. The above arrangement of the seal layer can protect the cathode connecting wire from being eroded by the water and oxygen in the organic planarization layer, so that the cathode lead-out wire and the cathode connecting wire can be effectively lapped, and the service life of the display panel can be increased. And a manufacturing process of the seal layer with the above-mentioned arrangement is simple and easy to implement, which can make the cathode lead-out wire and the cathode connecting wire lapped by two entire surfaces respectively corresponding to the cathode lead-out wire 1006 and the cathode connecting wire 1004, which can reduce an area occupied by the cathode lead-out wire and the cathode connecting wire, which helps to achieve a narrow frame of the display panel.

DETAILED DESCRIPTION OF THE EMBODIMENTS

A clear and complete description of the technical schemes in the embodiments of this application will be given below in combination with the drawings attached in the embodiments of this application. Obviously, the described embodiments are only a part of embodiments of the present application, not all embodiments of the present application. All other embodiments obtained by persons of ordinary skill in the art based on the embodiments of the present application without creative efforts shall fall within the protection scope of the present application.

Figure 1:
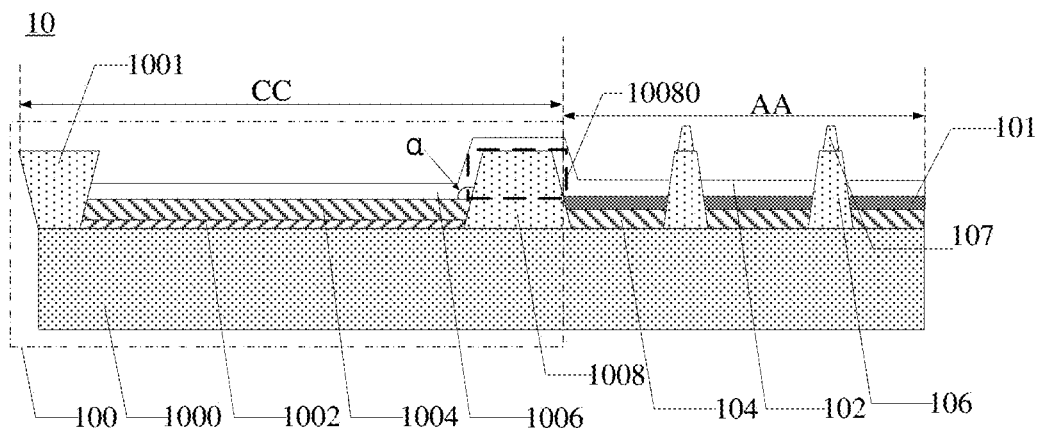
FIG. 1 is a schematic view illustrating the structure of a display panel in an embodiment of this application.

Please refer to FIG. 1, FIG. 1 is a schematic view illustrating the structure of a display panel according to an embodiment of this application. The display panel 10 may be an OLED display panel, a Micro-LED display panel and so on. A display area AA and a non-display area CC located around the display area AA are defined in the display panel 10. The display panel 10 includes a cathode lapping assembly 100 which locates in the non-display area CC of the display panel 10, and the cathode lapping assembly 100 includes an organic planarization layer 1000, a seal layer 1002, a cathode connecting wire 1004 and a cathode lead-out wire 1006 stacked sequentially. The cathode lead-out wire 1006 extends to the display area AA and connects with the cathode 102 in the display area AA, the cathode connecting wire 1004 is configured to receive an external circuit signal and send the external circuit signal to the cathode lead-out wire 1006, and then the cathode lead-out wire 1006 sends the external circuit signal to the cathode 102; and the seal layer 1002 is configured to block water and oxygen in the organic planarization layer 1000.

In this embodiment, the seal layer 1002 is formed by one of a silicon oxide layer, a silicon nitride layer, an aluminum oxide layer and a graphene layer; or the seal layer 1002 is stacked by at least two of a silicon oxide layer, a silicon nitride layer, an aluminum oxide layer and a grapheme layer. The seal layer 1002 of the above-mentioned material is easy to obtain, and has a good water and oxygen blocking effect. A thickness of the seal layer can be 0.5 micron to 3 microns, such as 1 micron, 2 microns and so on. The seal layer 1002 within this thickness range can not only satisfy the effect of blocking water and oxygen, but also does not increase the thickness of the frame of the display panel 10. When the material of the seal layer 1002 includes aluminum oxide, due to the relatively high density of the aluminum oxide, the thickness of the aluminum oxide layer can be in a relatively small range, the thickness of the seal layer 1002 can be in a relatively small range, for example, 0.5 micron to 1 micron (for example, 0.6 micron, 0.8 micron, etc.).

The above-mentioned arrangement of the seal layer 1002 can protect the cathode connecting wire 1004 from being eroded by the water and oxygen in the organic planarization layer 1000, so that the cathode lead-out wire 1006 and the cathode connecting wire 1004 can be effectively lapped, and the service life of the display panel 10 can be increased. And a manufacturing process of the seal layer 1002 with the above-mentioned arrangement is simple and easy to implement, which can make the cathode lead-out wire 1006 and the cathode connecting wire 1004 lapped by two entire surfaces respectively corresponding to the cathode lead-out wire 1006 and the cathode connecting wire 1004, which can reduce an area occupied by the cathode lead-out wire 1006 and the cathode connecting wire 1004, which helps to achieve a narrow frame of the display panel 10.

In this embodiment, the organic planarization layer 1000 may further extend to the display area AA of the display panel 10, the display panel 10 further comprises other structure disposed at a side of the organic planarization layer 1000 facing away from the cathode lead-out wire 1006 and cathode 102. The organic planarization layer 1000 can reduce or minimize the problem of uneven surface of other structures caused by the manufacturing process.

In addition, the material of the cathode lead-out wire 1006 can be the same as the material of the cathode 102, which can be metal, for example, magnesium-silver alloy, etc. With this design, the cathode lead-out wire 1006 and the cathode 102 can be simultaneously formed during the manufacturing process (such as, simultaneously formed by evaporation), thereby simplifying the manufacturing process. In addition, the above-mentioned display panel 10 corresponding to the display area AA further includes an anode 104, the anode 104 and the cathode 102 are arranged with an interval and opposite to each other, and the anode 104 is relatively closer to the organic planarization layer 1000 than the cathode 102. A material of the anode 104 is the same as a material of the cathode connecting wire 1004, which can be indium tin oxide, etc. This design can make the cathode connecting wire 1004 and the anode 104 be formed simultaneously in a manufacturing process, thereby simplifying the manufacturing process.

Further, the display panel 10 may further comprise a light-emitting layer 101 disposed in an interval area between the anode 104 and cathode 102 in the display area AA of the display panel 10, the light-emitting layer 101 can emit red light, green light, or blue light, etc. The outermost boundary of the light-emitting layer 101 can be regarded as the boundary between the display area AA and the non-display area CC.

Please continue to refer to FIG. 1. The cathode lapping assembly 100 may further includes a first organic limiting member 1008 and a second organic limiting member 1001 arranged with an interval. The first organic limiting member 1008 and the second organic limiting member 1001 are located on the organic planarization layer 1000, and the first organic limiting member 1008 is relatively closer to the display area AA of the display panel 10 than the second organic limiting member 1001. The seal layer 1002 and the cathode connecting wire 1004 are located in the interval area between the first organic limiting member 1008 and the second organic limiting member 1001; and the cathode lead-out wire 1006 covers the interval area between the first organic limiting member 1008 and the second organic limiting member 1001 and further covers the surface of the first organic limiting member 1008, so as to connect the cathode 102 located in the display area AA. The above-mentioned arrangement of the first organic limiting member 1008 and the second organic limiting member 1001 can better limit the positions of the sealing layer 1002 and the cathode connecting wire 1004, which is beneficial to control the width of the frame of the display panel 10. In addition, the first organic limiting member 1008 and the second organic limiting member 1001 are both in contact with the organic planarization layer 1000, so that the water and oxygen in the organic planarization layer 1000 can be spread and dispersed through the first organic limiting member 1008 and the second organic limiting member 1001. To further reduce water vapor, dry particles can also be set in the first organic limiting member 1008 and the second organic limiting member 1001.

Generally, the display panel 10 corresponding to the display area AA includes a pixel defining layer 106 located on the organic planarization layer 1000 in the display area AA. The material of the pixel defining layer 106 is generally organic, the anode 104, the light-emitting layer 101 and the cathode 102 corresponding to each sub-pixel are arranged in an opening area of the pixel defining layers 106. A material of the first organic limiting member 1008, a material of the second organic limiting member 1001 and a material of the pixel defining layer 106 are the same, so that the first organic limiting member 1008, the second organic limiting member 1001 and the pixel defining layer 106 can be formed simultaneously during the manufacturing process, thereby reducing the difficulty of the manufacturing process. Alternatively, the display panel 10 corresponding to the display area AA may further includes a spacer 107 located at a side of the pixel defining layer 106 facing away from the organic planarization layer 1000. The material of the spacer 107 is generally organic. The material of the first organic limiting member 1008 and the second organic limiting member 1001 can be the same as the material of the spacer 107, so that the first organic limiting member 1008, the second organic limiting member 1001 and the spacer 107 can be simultaneously formed during the manufacturing process, thereby reducing the difficulty of the manufacturing process. Still alternatively, the above-mentioned first organic limiting member 1008 and second organic limiting member 1001 may be formed by stacking the pixel defining layer 106 and the spacer 107, which is not restricted in the disclosure.

In addition, in this embodiment, please continue to refer to FIG. 1. A side of the first organic limiting member 1008 facing away from the second organic limiting member 1001 is contacted with the light-emitting layer 101 in the display area AA, that is, the first organic limiting member 1008 not only play a role in limiting the sealing layer 1002 and the cathode connecting wire 1004, but also play a role in limiting the light-emitting layer 101. The first organic limiting member 1008 may be located at the boundary between the display area AA and the non-display area CC, thereby reducing the width of the non-display area CC of the display panel 10, which is beneficial to realize a narrow frame of the display panel.

Further, please continue to refer to FIG. 1. The first organic limiting member 1008 includes a protruding portion 10080 exceeding from the cathode connecting wire 1004, and an angle α between a side wall (not indicated) of the protruding portion 10080 and a plane where the cathode connecting wire 1004 is located is greater than or equal to 90° and less than 180°, for example, the angle may be 120 degrees, 135 degrees, 150 degrees and so on. The design of this angle can reduce the probability of fracture of the cathode lead-out wire 1006 covering the first organic limiting member 1008.

In one embodiment, in a direction from the organic planarization layer 1000 to the cathode connecting wire 1004, a cross section of the first organic limiting member 1008 is a regular trapezoid. This design can reduce the probability of fracture of the cathode lead-out wire 1006 covering the first organic limiting member 1008, and can also reduce the complexity of the manufacturing process of forming the first organic limiting member 1008. Further, as shown in FIG. 1, in the direction from the organic planarization layer 1000 to the cathode connecting wire 1004, a cross section of the second organic limiting member 1001 is an inverted trapezoid. This design can make the interval space between the first organic limiting member 1008 and the second organic limiting member 1001 larger, and can increase the covering area of the cathode connecting wire 1004, and can increase the lap area between the cathode lead-out wire 1006 and the cathode connecting wire 1004, and can reduce the lap resistance, so that the display quality of the display panel is improved.

Certainly, in other embodiments, in the direction from the organic planarization layer 1000 to the cathode connecting wire 1004, the first organic limiting member 1008 and the second organic limiting member 1001 may also be other structures. For example, a cross section of the protruding portion 10080 of the first organic limiting member 1008 is a regular trapezoid, while a cross section of the part below the protruding portion 10080 may be a cylindrical, or other types of trapezoid, etc. For example, a cross section of the first organic limiting member 1008 and a cross section of the second organic limiting member 1001 may be cylindrical, etc.

Figure 2:
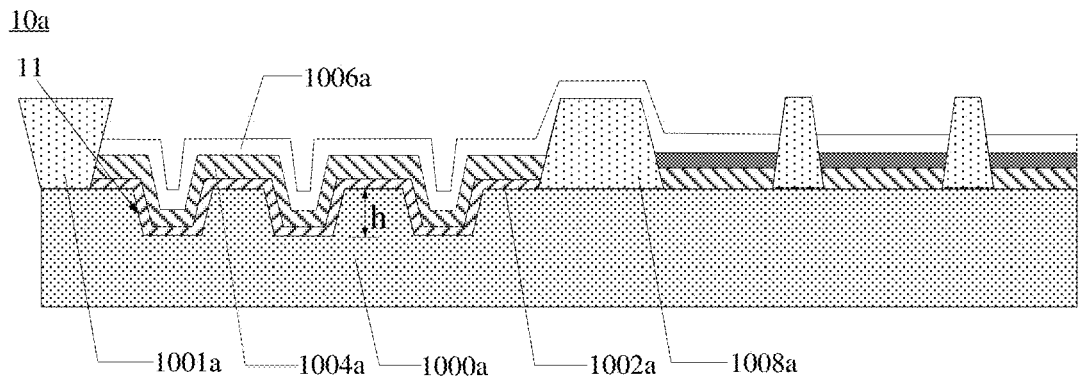
FIG. 2 is another schematic view illustrating the structure of a display panel in an embodiment of this application.

In another embodiment, please refer to FIG. 2, which is a schematic structural diagram of another embodiment of the display panel of the present application. The organic planarization layer 1000a located between the first organic limiting member 1008a and the second organic limiting member 1001a comprises a side surface 11 facing to the cathode connecting wire 1004a, the side surface 11 is a continuous concave-convex surface. The seal layer 1002a and the cathode connecting wire 1104a cover the concave-convex surface, and the seal layer 1002a and the cathode connecting wire 1004a form a structure with a continuous concave-convex shape. The patterned concave-convex surface of the organic planarization layer 1000a can increase the lap area between the cathode lead-out wire 1006a and the cathode connecting wire 1004a, thereby reducing the lap resistance, thereby improving the display quality of the display panel; and under the same condition, this design is conducive to reducing a width of the frame of the display panel 10a, that is, it is conducive to achieving a narrow frame of the display panel.

In this embodiment, in a direction from the organic planarization layer 1000a to the cathode connecting wire 1004a, in FIG. 2, a cross section of a portion of the organic planarization layer corresponding to a convex surface of the concave-convex surface can be any one of square, rectangular, rhombus, and trapezoid etc.

Moreover, in FIG. 2, a height h of a portion of the organic planarization layer between the convex surface of the concave-convex surface and the concave surface of the concave-convex surface accounts for 0.2-0.8 of a thickness of the entire organic planarization layer 1000a (such as, 0.3, 0.5, 0.7 etc.). On the premise that the height h of the portion of the organic planarization layer between the convex surface and the concave surface within this thickness range can increase the contact area between the cathode lead-out wire 1006a and the cathode connecting wire 1004a, the unpatterned portion reserved under the portion of the organic planarization layer between the convex surface and the concave surface will ensure its ability to cover the underlying structure with uneven surface like particles.

Figure 3:
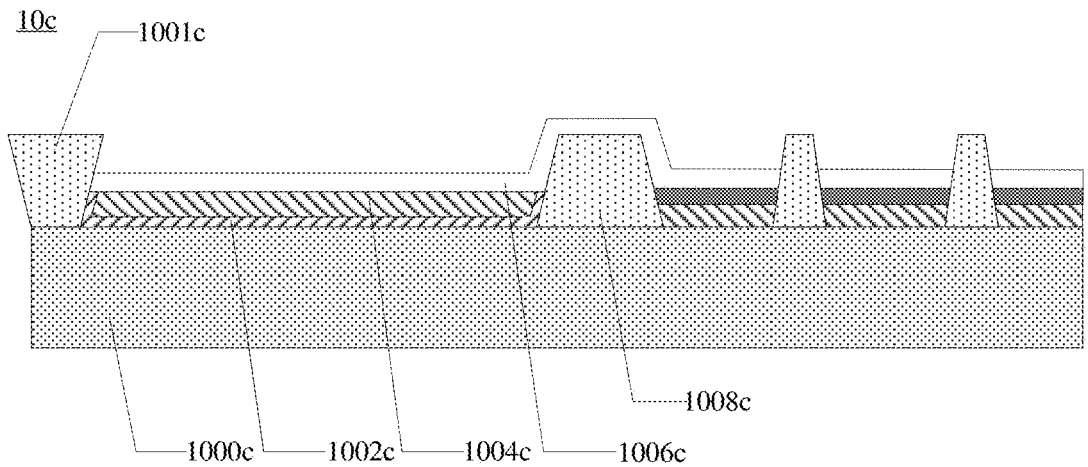
FIG. 3 is another schematic view illustrating the structure of a display panel in an embodiment of this application.

In another embodiment, please refer to FIG. 3, which is a schematic structural diagram of another embodiment of the display panel of the present application. The difference between the display panel 10c and the display panel 10 in FIG. 1 is that the seal layer 1002c may further covers at least a part of a first surface of the first organic limiting member 1008c and at least a part of a second surface of the second organic limiting member 1001c, the first surface of the first organic limiting member is disposed opposite to the second surface of the second organic limiting member. This design can protect the cathode connecting wire 1004c from being corroded by the water and oxygen from the first organic limiting member 1008c and the second organic limiting member 1001c which is located around the cathode connecting wire 1004c, so that the cathode lead-out wire 1006c and cathode connecting wire 1004c can be effectively lapped, and the service life of the display panel 10c can be improved.

Referring back to FIG. 1, the display panel 10 provided by the present application will be further explained from the perspective of the manufacturing method.

A, providing a substrate, the substrate may be rigid or flexible, wherein the substrate defines a display area AA and a non-display area CC.

B, forming a thin film transistor layer at one side of the substrate, the thin film transistor layer covers the display area AA, and the thin film transistor layer is used to drive the pixels in the display panel 10 to turn on or turn off.

C, forming an organic planarization layer 1000 on the side of the substrate with the thin film transistor layer, the organic planarization layer 1000 covers the thin film transistor layer located in the display area AA and covers the non-display area CC.

D, forming a patterned pixel defining layer 106 on the side of the organic planarization layer 1000 facing away from the substrate, the patterned pixel defining layer 106 is corresponding to the display area AA, and forming a first organic limiting member 1008 and a second organic limiting member 1001 on the side of the organic planarization layer facing away from the substrate, the first organic limiting member 1008 and the second organic limiting member 1001 is corresponding to the non-display area CC; wherein, if the material of the pixel defining layer 106, the material of the first organic limiting member 1008 and the material of the second organic limiting member 1001 are the same, the pixel defining layer 106, the first organic limiting member 1008 and the second organic limiting member 1001 can be formed simultaneously.

E, forming a seal layer 1002 in the interval area between the first organic limiting member 1008 and the second organic limiting member 1001 by a method of chemical vapor deposition.

F, forming a cathode connecting wire 1004 on the seal layer 1002, forming an anode in the opening of the pixel defining layer 106. When the material of the cathode connecting wire 1004 and the material of the anode 104 are the same, the cathode connecting wire 1004 and the anode 104 can be formed simultaneously.

G, forming a light-emitting layer 101 on the anode 104.

H, forming a cathode lead-out wire 1006 on the cathode connecting wire 1004, forming a cathode 102 on the light-emitting layer 101, the cathode 102 is electrically connected with the cathode lead-out wire 1006; when a material of the cathode lead-out wire 1006 and a material of cathode 102 are the same, the cathode lead-out wire 1006 and the cathode 102 can be formed simultaneously.

When the structure of the display panel 10*a* is as shown in FIG. 2, before the above-mentioned step E, the manufacturing method of present application further includes: patterning the surface of the organic planarization layer 1000*a* located between the first organic limiting member 1008*a* and the second organic limiting member 1001*a* and facing away from the substrate to form a concave-convex surface of the organic planarization 1000*a*.

The above description is only the embodiments of the present application and does not limit the patent scope of the present application, any equivalent structure or equivalent process modification used according to the contents of the specification and accompanying drawings in the present application, no matter whether it is directly or indirectly used in any other related technical field, should be included within the protection scope of the present application.

What is claimed is:

1. A display panel defining a display area and a non-display area located around the display area, comprising:
a cathode lapping assembly located in the non-display area of the display panel, wherein the cathode lapping assembly comprises an organic planarization layer, a seal layer, a cathode connecting wire and a cathode lead-out wire stacked sequentially,
wherein the cathode lead-out wire extends to the display area and connects with a cathode in the display area, the cathode connecting wire is configured to receive an external circuit signal and send the external circuit signal to the cathode lead-out wire, and the seal layer is configured to block water and oxygen in the organic planarization layer,
wherein the cathode lapping assembly further comprises:
a first organic limiting member and a second organic limiting member located on the organic planarization layer and arranged with an interval, wherein the first organic limiting member and the second organic limiting member are in contact with the organic planarization layer, the first organic limiting member and the second organic limiting member are configured to limit positions of the seal layer and the cathode connecting wire, the first organic limiting member is relatively closer to the display area of the display panel than the second organic limiting member, and the seal layer and the cathode connecting wire are only formed between the first organic limiting member and the second organic limiting member, the organic planarization layer located between the first organic limiting member and the second organic limiting member comprises a side surface facing the cathode connecting wire, the side surface is a continuous concave-convex surface, the seal layer and the cathode connecting wire cover the concave-convex surface, the seal layer and the cathode connecting wire form a structure with a continuous concave-convex shape, and a height of a portion of the organic planarization layer between a convex surface of the concave-convex surface and a concave surface of the concave-convex surface accounts for 20%-80% of a thickness of the entire organic planarization layer.

2. The display panel of claim 1, wherein the organic planarization layer extends to the display area of the display panel, the display panel corresponding to the display area comprises a pixel defining layer located at a side of the organic planarization layer, and a material of the first organic limiting member, a material of the second organic limiting member and a material of the pixel defining layer are the same.

3. The display panel of claim 1, wherein the organic planarization layer extends to the display area of the display panel, the display panel corresponding to the display area comprises a pixel defining layer located at a side of the organic planarization layer and a spacer located at a side of the pixel defining layer facing away from the organic planarization layer, and a material of the first organic limiting member, a material of the second organic limiting member and a material of the spacer are the same.

4. The display panel of claim 1, wherein the first organic limiting member comprises a protruding portion exceeding the cathode connecting wire, and an angle between a side wall of the protruding portion and a plane where the cathode connecting wire is located is greater than or equal to 90° and less than 180°.

5. The display panel of claim 4, wherein in a direction from the organic planarization layer to the cathode connecting wire, and a cross section of the first organic limiting member is a regular trapezoid.

6. The display panel of claim 5, wherein in a direction from the organic planarization layer to the cathode connecting wire, a cross section of the second organic limiting member is an inverted trapezoid.

7. The display panel of claim 1, wherein in a direction from the organic planarization layer to the cathode connecting wire, a cross section of a portion of the organic planarization layer corresponding to a convex surface of the concave-convex surface can be any one of square, rectangular, rhombus and trapezoid.

8. The display panel of claim 1, wherein the first organic limiting member comprises a first protruding portion exceeding from the seal layer and the second organic limiting member comprises a second protruding portion exceeding from the seal layer, the seal layer further covers at least a part of a first surface of the first protruding portion and at least a part of a second surface of the second protruding portion, the first surface of the first protruding portion is disposed opposite to the second surface of the second protruding portion.

9. The display panel of claim 1, wherein the seal layer is formed by one of a silicon oxide layer, a silicon nitride layer, an aluminum oxide layer and a graphene layer; or the seal layer is stacked by at least two of a silicon oxide layer, a silicon nitride layer, an aluminum oxide layer and a graphene layer.

10. The display panel of claim 1, wherein a thickness of the seal layer is 0.5 micron to 3 microns.

11. The display panel of claim 10, wherein when a material of the seal layer comprises aluminum oxide, the thickness of the seal layer is 0.5 micron to 1 micron.

12. The display panel of claim 1, wherein the display panel corresponding to the display area further comprises an anode, and a material of the anode is the same as a material of cathode connecting wire.

13. The display panel of claim 1, wherein a material of a cathode lead-out wire is the same as a material of the cathode.

14. The display panel of claim 1, wherein the cathode lapping assembly further comprises: dry particles, configured to reduce water vapor and disposed in the first organic limiting member and the second organic limiting member.

15. The display panel of claim 1, wherein the first organic limiting member and the second organic limiting member are in direct contact with the organic planarization layer.

* * * * *